(12) United States Patent
Omenetto et al.

(10) Patent No.: US 12,261,346 B2
(45) Date of Patent: Mar. 25, 2025

(54) MICROWAVE METADEVICE COMPRISING A SUBSTRATE HAVING THEREON A RESONATOR LOOP WITH AT LEAST ONE GAP AND AT LEAST ONE ELECTROCHEMICAL TRANSISTOR DISPOSED THEREIN

(71) Applicant: Trustees of Tufts College, Medford, MA (US)

(72) Inventors: Fiorenzo G. Omenetto, Lexington, MA (US); Giorgio E. Bonacchini, Palo Alto, CA (US)

(73) Assignee: Trustees of Tufts College, Medford, MA (US)

(*) Notice: Subject to any disclaimer, the term of this patent is extended or adjusted under 35 U.S.C. 154(b) by 638 days.

(21) Appl. No.: 17/449,935

(22) Filed: Oct. 4, 2021

(65) Prior Publication Data

US 2022/0108848 A1 Apr. 7, 2022

Related U.S. Application Data

(60) Provisional application No. 63/086,805, filed on Oct. 2, 2020.

(51) Int. Cl.
*H01P 7/08* (2006.01)
*H10K 19/10* (2023.01)

(52) U.S. Cl.
CPC ............ *H01P 7/088* (2013.01); *H10K 19/10* (2023.02)

(58) Field of Classification Search
CPC ........ H01P 7/088; H01P 7/00; H01P 1/20381; H10K 19/10
USPC ....................................................... 333/219
See application file for complete search history.

(56) References Cited

U.S. PATENT DOCUMENTS

| | | | | |
|---|---|---|---|---|
| 9,459,375 | B2* | 10/2016 | Sonkusale et al. | .... G02B 1/002 |
| 9,608,564 | B2* | 3/2017 | Poddar et al. | .......... H01P 5/028 |
| 9,733,544 | B2* | 8/2017 | Sayyah et al. | ..... H01Q 15/0086 |
| 2004/0211989 | A1* | 10/2004 | Armgarth et al. | ....... C09K 9/02 |
| | | | | 257/253 |

* cited by examiner

*Primary Examiner* — Benny T Lee
(74) *Attorney, Agent, or Firm* — GTC Law Group PC & Affiliates

(57) ABSTRACT

Embodiments of the present disclosure provide a metadevice including a substrate, a resonator loop coupled to the substrate. The resonator loop having a first gap in the resonator loop. The metadevice includes an organic electrochemical transistor positioned in the first gap, a gate electrode, and an electrolyte extending between the organic electrochemical transistor and the gate electrode.

20 Claims, 14 Drawing Sheets

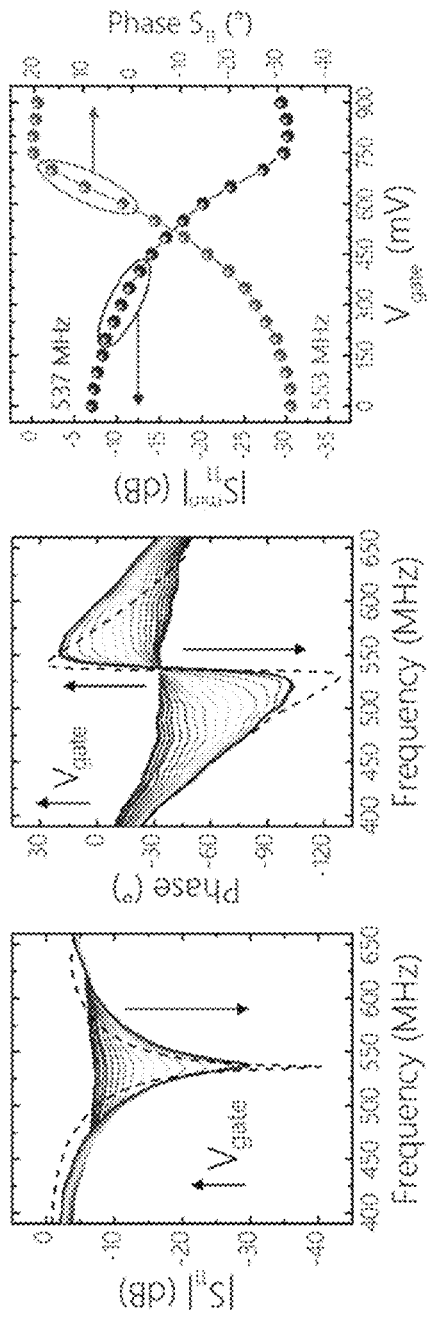
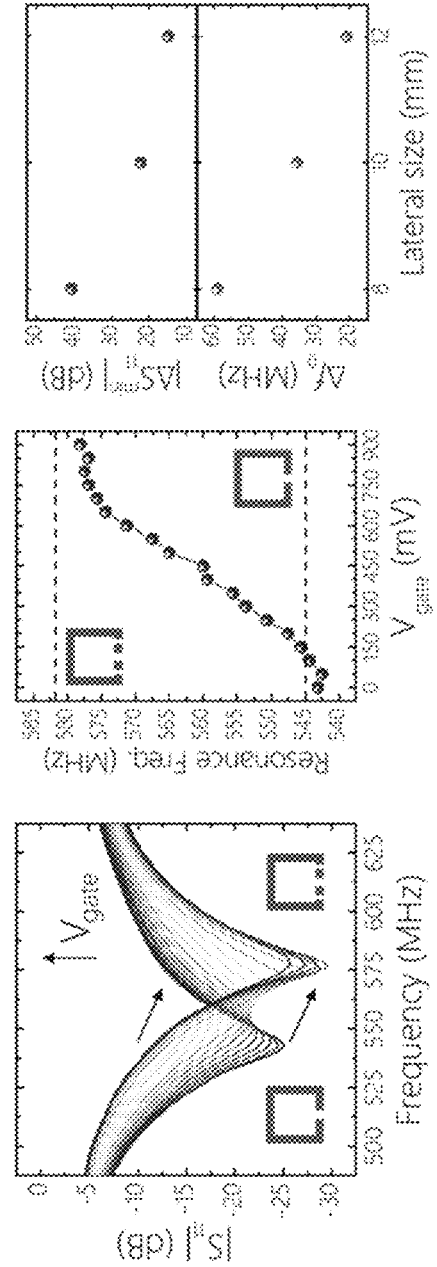
FIG. 4A
FIG. 4B
FIG. 4C
FIG. 4D
FIG. 4E
FIG. 4F

MICROWAVE METADEVICE COMPRISING A SUBSTRATE HAVING THEREON A RESONATOR LOOP WITH AT LEAST ONE GAP AND AT LEAST ONE ELECTROCHEMICAL TRANSISTOR DISPOSED THEREIN

CROSS-REFERENCE TO RELATED APPLICATIONS

This application claims priority to and the benefit of U.S. Patent Application No. 63/086,805, filed Oct. 2, 2020, all of which is herein incorporated by reference in its entirety.

STATEMENT REGARDING FEDERALLY SPONSORED RESEARCH

This invention was made with government support under grant N00014-19-1-2399 awarded by the United States Navy. The government has certain rights in the invention.

BACKGROUND

Electrical metamaterials, artificial structures for controlling electromagnetic waves on a subwavelength scale, were initially proposed as exotic lensing and cloaking technologies. In recent years, efforts have been devoted to development of reconfigurable metadevices through the integration of passive metameterial structures with different types of tuning mechanisms. These metadevices, driven by electrical, optical, magnetic, mechanical, micro- and nanoelectromechanical or thermal stimuli, have been investigated for both sensing and actuation. One approach for tuning metadevices includes electrical gating via free-carrier doping using semiconductors (e.g., gallium arsenide, silicon, and germanium), atomically thin two-dimensional materials (e.g., graphene and molybdenum disulfide) and transparent conducting oxides or nitrides. However, these materials typically require sophisticated and costly fabrication methods and are not compatible with large-area and flexible platforms, which limits the wider applicability and versatility of metadevice technologies.

SUMMARY OF THE DISCLOSURE

The present disclosure addresses the aforementioned shortcomings by providing systems and methods that utilize an electrical tuning mechanism for reconfigurable microwave metadevices that are electrically tuned by organic electrochemical transistors. Metadevices including organic electrochemical transistors allow for rapid, facile realization of reconfigurable microwave metasurfaces, with broad utility extending into fields of bioelectronics and neuromorphic devices. The tuning mechanism is based on the ability to electrostatically control the charge carrier density of the organic electrochemical transistor. Organic electrochemical transistors may be formed from conjugated conducting and semiconducting polymers having charge carrier density that can be electrostatically controlled, while displaying favorable synthetic tunability and versatile multi-scale processability. The metadevices provided herein may be fabricated via inkjet printing onto flexible substrates (e.g., polimide) using metal nanoparticle and conducting polymer inks.

In one aspect, the present disclosure provides a metadevice comprising a resonator loop coupled to a substrate. The resonator loop may have at least one gap formed between opposing surfaces in the resonator loop. The metadevice may further comprises an organic electrochemical transistor extending positioned in the at least one gap. The metadevice may further comprise a gate electrode and an electrolyte extending between the organic electrochemical transistor and the gate electrode.

These and other advantages and features of the present invention will become more apparent from the following detailed description of the preferred embodiments of the present invention when viewed in conjunction with the accompanying drawings, where like features are denoted by the same reference label throughout the detail description of the drawings.

DESCRIPTION OF THE DRAWINGS

FIG. 4A is a graph illustrating amplitude modulation of the DBSRR for increasing $V_{gate}$ in accordance with some embodiments of the present disclosure. The arrow represents the trend in Sn with increasing gate voltage.

FIG. 4B is a graph illustrating phase modulation of the DBSRR for increasing $V_{gate}$ in accordance with some embodiments of the present disclosure. The arrows represent the trends in phase with increasing gate voltage.

FIG. 4C is a graph illustrating voltage dependence of the amplitude/phase of the $S_{11}$ parameter at/near the resonance frequency in accordance with some embodiments of the present disclosure. The arrows represent the trend in both $S_{11}$ amplitude and phase as a function of voltage dependence.

FIG. 4D is a graph illustrating $S_{11}$ plots of the frequency modulated device for increasing $V_{gate}$ in accordance with some embodiments of the present disclosure. The arrow represents the trend in frequency as a function of increasing gate voltage.

FIG. 4E is a graph illustrating voltage dependence of the resonance frequency: dashed lines report the resonance frequency of the two different DBSRR configurations with and without additional gaps (see insets) in accordance with some embodiments of the present disclosure, showing that the active frequency shift does not appear to be limited by the tuning strategy.

FIG. 4F is a graph illustrating maximum amplitude (top) and frequency modulation (bottom) of devices of different size, i.e. operating at different frequencies in accordance with some embodiments of the present disclosure.

DETAILED DESCRIPTION OF THE DISCLOSURE

Before the present disclosure is described in further detail, it is to be understood that the invention is not limited to the particular embodiments described. It is also to be understood that the terminology used herein is for the purpose of describing particular embodiments only, and is not intended to be limiting. The scope of the present invention will be limited only by the claims. As used herein, the singular forms "a", "an", and "the" include plural embodiments unless the context clearly dictates otherwise.

It should be apparent to those skilled in the art that many additional modifications beside those already described are possible without departing from the inventive concepts. In interpreting this disclosure, all terms should be interpreted in the broadest possible manner consistent with the context. Variations of the term "comprising" should be interpreted as referring to elements, components, or steps in a non-exclusive manner, so the referenced elements, components, or steps may be combined with other elements, components, or steps that are not expressly referenced. Embodiments referenced as "comprising" certain elements are also contemplated as "consisting essentially of" and "consisting of" those elements.

In places where ranges of values are given, this disclosure explicitly contemplates other combinations of the lower and upper limits of those ranges and sub-ranges that fall therein, which may not be explicitly recited. For example, recitation of a value between 1 and 10 also contemplates values, e.g., from 2 to 9, from 2 to 8, or from 3 to 4. Ranges identified as being "between" two values are inclusive of the end-point values. For example, recitation of a value between 1 and 10 includes the values 1 and 10.

Features of this disclosure described with respect to a particular method, apparatus, composition, or other aspect of the disclosure can be combined with, substituted for, integrated into, or in any other way utilized with other methods, apparatuses, compositions, or other aspects of the disclosure, unless explicitly indicated otherwise or necessitated by the context. For clarity, an aspect of the invention described with respect to one method can be utilized in other methods described herein, or in apparatuses or with compositions described herein, unless context clearly dictates otherwise.

The present disclosure provides an electrical tuning mechanism for microwave metadevices based on an organic electrochemical transistor that allows for rapid, facile realization of reconfigurable microwave metasurfaces.

Figures 1A, 1B:
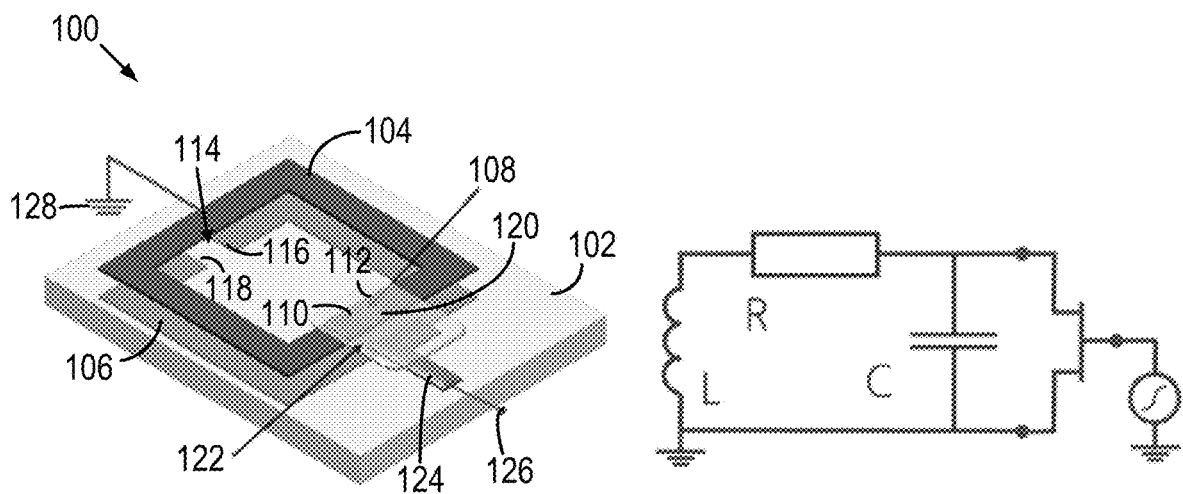
FIG. 1A is a schematic illustration of a metadevice in accordance with some embodiments of the present disclosure. The metadevice is in an amplitude-modulated Double Broadside-coupled split-ring resonator (DBSRR) configuration.
FIG. 1B is a schematic illustration of the amplitude-modulated DBSRR's equivalent circuit model where an organic electrochemical transistor (OECT) is connected in parallel to the effective capacitance of the DBSRR (C is capacitance, R is resistance, L is inductance).
Figure 2:
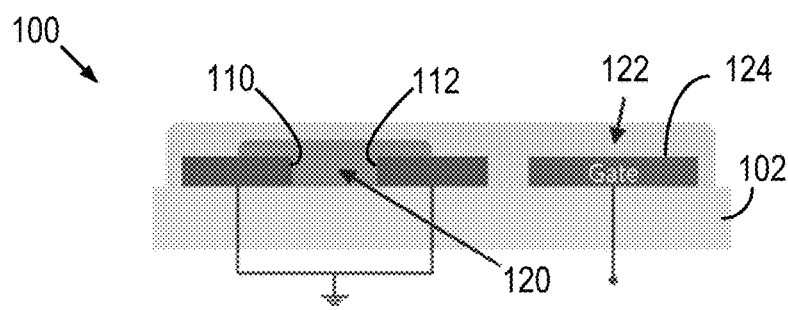
FIG. 2 is a cross-sectional view of the metadevice of FIG. 1A.

Referring to FIGS. 1A and 1B and FIG. 2, a metadevice 100 (FIGS. 1A and 2) is depicted in accordance with some embodiments of the present disclosure. The metadevice 100 includes a substrate 102 (FIGS. 1A and 2) having a first resonator loop 104 (FIG. 1A) and a second resonator loop 106 (FIG. 1A) disposed on a surface of the substrate 102. In some embodiments, the first resonator loop 104 (FIG. 1A) and the second resonator loop 106 (FIG. 1A) may be configured on the substrate 102 to form a split-ring resonator. The first resonator loop 104 (FIG. 1A) may have at least one gap 108 (FIG. 1A) formed between opposing surfaces 110, 112 (FIG. 2) in the first resonator loop 104, and the second resonator loop 106 (FIG. 1A) may have at least one gap 114 (FIG. 1A) formed between opposing surfaces 116, 118 (FIG. 1A) in the second resonator loop 106 to form the split-ring resonator. The resonator loops 104, 106 (FIG. 1A) may have various geometries including, but not limited to, square loop resonators, rectangular loop resonators, or cylindrical loop resonators.

The split-ring resonator may be orientated in various configurations. As depicted in FIG. 1A, the first resonator loop 104 and the second resonator loop 106 may be assembled in a stacked, antiparallel configuration to form a Double Broadside-coupled split-ring resonator (DBSRR). In the DBSRR configuration, the first resonator loop 104 is coupled to a first facial surface of the substrate 102, and the second resonator loop 106 is coupled to an opposing facial surface of the substrate 102. The gap 108 of the first resonator loop 104 is positioned on an opposite side in the stacked arrangement relative to the gap 114 of the second resonator loop 106. The DBSRR configuration offers the advantage of having a smaller form factor and a lower resonant frequency compared to other magnetic SRR-based structures with equivalent lateral dimensions, without loss of generality for the applicability of the tuning strategy disclosed herein.

Additionally or alternatively, the first resonator loop 104 and the second resonator loop 106 may be assembled into an edge-coupled split-ring resonator (ECSRR). In the ECSRR configuration, the first resonator loop 104 and the second resonator loop 106 are coupled to the same facial surface of the substrate 102, and either the first resonator loop 104 or the second resonator loop 106 is configured to be concentric to, or otherwise positioned inside of, the other respective loop. Similar to the DBSRR configuration, the gaps 108, 114 are configured to be opposite one another in the arrangement.

Circuit properties may be selectively tuned or controlled in the metadevice 100 by incorporating an organic electrochemical transistor 120 in at least one gap 108, 114 of the metadevice 100. In some embodiments, the organic electrochemical transistor 120 is positioned in or extends between the opposing surfaces 110, 112 in the at least one gap 108. The organic electrochemical transistor 120 may be printed or deposited to fill the gap 108. In some embodiments, the organic electrochemical transistor 120 completely fills the gap 108. Additionally or alternatively, the organic electrochemical transistor 120 is in direct contact with one or both of the opposing surfaces 110, 112. In some embodiments, the organic electrochemical transistor 120 completely surrounds the opposing surfaces 110, 112 and contacts at least a portion of a top surface of the first resonator loop 106, as shown in FIG. 2.

In some embodiments, the gap 114 of the second resonator loop 106 is substantially or entirely free of an organic electrochemical transistor material. In some embodiments, the gap 114 of the second resonator loop 106 comprises an electrical insulator (e.g., a gas, liquid, or solid insulating material).

In some embodiments as shown in FIGS. 1 and 2A, the bulk conductivity of the organic electrochemical transistor 120 is electrostatically controlled through the addition or injection of an electrolyte 122 (e.g., mobile ionic species) into the organic electrochemical transistor 120 by a gate electrode 124. In some embodiments, the electrolyte 122 extends between the organic electrochemical transistor 120 and the gate electrode 124 to place them in electrical communication. The gate electrode 124 may control the addition or injection of the electrolyte 122 by modifying the applied voltage. In some embodiments, the applied voltage may vary between 0 mV and 1000 mV, which in turn modifies the amplitude and/or phase of the metadevice 100. The gate electrode 124 may be coupled to a source 126 (FIG. 1A), and the first resonator loop 104 may be coupled to a drain 128 (FIG. 1A) via suitable electronic connections.

In some embodiments, the gate electrode 124 is coated with an organic electrochemical transistor material. The material coating the gate electrode 124 may be the same or different as the material used in the organic electrochemical transistor 120 positioned in the gap 108 of the first resonator loop 104. In some embodiments, the organic electrochemical transistor material partially coats the gate electrode 124. In some embodiments, the organic electrochemical transistor material completely surrounds the gate electrode 124. The gate electrode 124 may electrostatically control the bulk hole/electron conductivity of the organic electrochemical transistor 120 through the addition or subtraction of mobile ionic species from the electrolyte 122, e.g., by regulating the applied voltage.

In some embodiments, the gate electrode 124 is used in conjunction with a controller (not shown) for regulating the applied voltage. The controller and the gate electrode 124 may be placed in electrical communication to send and receive electrical signals, e.g., via source 126. Suitable connections may include transmitters that allow process signals, such as electrical signals, to be transmitted between the controller and the gate electrode 124. The controller includes a processor and a memory that includes software and data, and is designed for storage and retrieval of processed information to be processed by the processor. The processor may receive input data or process signals from the gate electrode 124. The controller may operate autonomously or semi-autonomously, or may read executable software instructions from the memory or a computer-readable medium (e.g., a hard drive, a CD-ROM, flash memory), or may receive instructions via the input from a user, or another source logically connected to a computer or device, such as another networked computer or server. In some embodiments, the electrical signals may be transferred via a wired connection or through a wireless network connection. Other hardware elements may be included in the process control system, for example, transducers, analog-to-digital (A/D) converters, and digital-to-analog (D/A) converters that allow process information to be recognizable in computer form, and computer commands accessible to the process.

In some embodiments, the controller may regulate the voltage to the metadevice 100 to control the bulk hole/electron conductivity of the organic electrochemical transistor 120 via the addition or injection of the electrolyte 122. In some embodiments, the controller includes programming to regulate the voltage from 0 mV to 1000 mV to achieve a desired conductivity of the organic electrochemical transistor 120 and/or operating frequency of the metadevice 100. In some embodiments, the controller may regulate the voltage of the metadevice 100 to achieve a desired operating frequency. In some embodiments, the metadevice 100 may be sized and modulated via the applied voltage to operate in the sub-5-GHz range, e.g., from 700 MHz to 5 GHz.

In some embodiments, the organic electrochemical transistor described herein is composed of a conjugated conducting and/or semiconducting polymer (e.g., organic ion-electron mixed conductors). As used herein, the term "polymer" may refer to a compound prepared by polymerizing monomers, whether of the same or a different type, that in polymerized form provide the multiple and/or repeating "units" or "mer units" that make up a polymer. The generic term "polymer" thus embraces the term "homopolymer", usually employed to refer to polymers prepared from only one type of monomer, and the term "copolymer", usually employed to refer to polymers prepared from at least two types of monomers. It also embraces all forms of copolymers, e.g., random, block, etc. It is noted that although a polymer is often referred to as being "made of" one or more specified monomers, "based on" a specified monomer or monomer type, "containing" a specified monomer content, or the like, in this context the term "monomer" is understood to be referring to the polymerized remnant of the specified monomer and not to the unpolymerized species. In general, polymers herein are referred to has being based on "units" that are the polymerized form of a corresponding monomer.

In some embodiments, the organic electrochemical transistor described herein is composed of a conjugated conducting or semiconducting polymer including, but not limited to, conjugated polymer/polyelectrolyte blends (e.g., PEDOT:PSS), conjugated polymer/polymer electrolyte blends, conjugated polymer/polyelectrolyte co-polymers, conjugated polymer/polymer electrolyte copolymers, conjugated polyelectrolytes, conjugated polymer electrolytes, or combinations thereof.

In some embodiments, the organic electrochemical transistor described herein includes, but is not limited to, a thiophene-based polymer (e.g., a 3,4-ethylenedioxythiophene-based polymer), a p-phenylene sulfide-based polymer, a pyrrole-based polymer, a carbazole-based polymer, an indole-based polymer, an azepine-based polymer, an aniline-based polymer, a fluorene-based polymer, a phenylene-based polymer, a pyrene-based polymer, an azulene-based polymer, a napthalene-based polymer, an acetylene-based polymer, a p-phenylene vinylene-based polymer, a styrene sulfonate-based polymer, or copolymers and mixtures thereof.

As used herein, the term "-based polymer" refers to a polymer that contains one or more polymerized monomer, and may contain at least one comonomer. For example, the term the term "thiophene-based polymer," includes one polymerized thiophene monomer and, optionally, may contain at least one comonomer. In some embodiments, the conjugated conductive polymer includes a thiophene/styrene sulfonate polymer. As used herein, the term "thiophene/styrene sulfonate" refers to a copolymer prepared from polymerizing a thiophene monomer with a styrene sulfonate monomer. In some embodiments, the conjugated conductive polymer comprises or consists of poly (3,4-ethylenedioxythiophene): polystyrene sulfonate.

In some embodiments, the first resonator loop 104, the second resonator loop 106, and/or the gate electrode 124 are composed of a conductive material, such as a metal. Suitable metals include, but are not limited to, silver, gold, aluminum, copper, lead, tin, titanium, zinc, alloys thereof, and combinations thereof.

In some embodiments, the substrate described herein is a flexible substrate. In some embodiments, the substrate described herein is biocompatible and/or degradable. In some embodiments, the substrate described herein is composed of a polymer, a polypeptide, or a biologically-compatible polymer. Suitable substrates include, but are not limited to, polyethylene oxide (PEO), polyethylene glycols (PEGs), a fibroin, fibronectin, polyaspartic acid, polylysine, alginate, chitosan, chitin, hyaluronic acid, pectin, polycaprolactone, polylactic acid, polyhydroxyalkanoates, dextrans, PLA-PGA, polyanhydride, polyorthoester, polyfumarate, actin, collagen, catenin, claudin, coilin, elastin, elaunin, extensin, fibrillin, lamin, laminin, keratin, tublin, a viral structural protein, zein protein, or combinations or mixtures thereof.

In some embodiments, the substrate described herein comprises silk fibroin. As used herein, "silk fibroin" or "SF", may refer to a biopolymer produced from silkworm fibroin and insect or spider silk protein. For example, silk fibroin useful for the present disclosure may be that produced by a number of species, including, without limitation: *Antheraea mylitta; Antheraea pernyi; Antheraea yamamai; Galleria mellonella; Bombyx mori; Bombyx mandarina; Galleria mellonella; Nephila clavipes; Nephila senegalensis; Gasteracantha mammosa; Argiope aurantia; Araneus diadematus; Latrodectus geometricus; Araneus bicentenarius; Tetragnatha versicolor; Araneus ventricosus; Dolomedes tenebrosus; Euagrus chisoseus; Plectreurys tristis; Argiope trifasciata; and Nephila madagascariensis*. Alternatively, silk utilized in the present disclosure may be prepared through an artificial process, for example, involving genetic engineering of cells or organisms (e.g., genetically engineered bacteria, yeast, mammalian cells, non-human organisms, including animals, or transgenic plants).

SF is a structural protein, like collagen, but with a unique feature: it is produced from the extrusion of an amino-acidic solution by a living complex organism into the external environment, while collagen is produced in vivo, in the extracellular space by self-assembly of cell-produced monomers and not secreted to the external environment. SF properties are derived from its structure, which consists of hydrophobic blocks staggered by hydrophilic, acidic spacers. In its natural state, SF is organized into semicrystalline materials with β-sheet crystals alternated with amorphous regions, which provide strength and resilience to the protein materials formed from the protein. The multiplicities of forms in which regenerated SF can be processed at a low to high protein concentration and low to high molecular weight make it attractive for several high-tech applications.

Processing of SF generally involves the partial or total dehydration of a fibroin solution (protein content of about 1 wt % to about 15 wt %) to form, e.g., films, sponges, gels, spheres (micron- to nano-sized) and foams with numerous techniques (e.g. solvent casting, freeze drying, salt leaching, sonication). These fabrication processes provide a robust material that combines mechanical strength with biochemical properties.

The silk fibroin solutions used in methods and compositions provided herein may be obtained from a solution containing a dissolved silkworm silk, such as, for example, from *Bombyx mori*. Alternatively, the silk fibroin solution may be obtained from a solution containing a dissolved spider silk, such as, for example, from *Nephila clavipes*. The silk fibroin solution can also be obtained from a solution containing a genetically engineered silk such as from bacteria, yeast, mammalian cells, transgenic animals or transgenic plants. See, for example, WO 97/08315 and U.S. Pat. No. 5,245,012. Genetically engineered silk can, for example, also comprise a therapeutic agent, e.g., a fusion protein with a cytokine, an enzyme, or any number of hormones or peptide-based drugs, antimicrobials and related substrates.

Silk fibroin solution can be prepared by any conventional method known to one skilled in the art. In some embodiments, a silk solution is an aqueous silk solution. In other embodiments, silk solutions may contain a second polymer to facilitate transitions to the solid state (e.g., polyethylene glycol, collagen, hyaluronic acid, and the like.).

Silkworm cocoon silk contains two structural proteins, the fibroin heavy chain (~350 kDa); and the fibroin light chain (about 25 kDa), which are associated with a family of non-structural proteins termed "sericins", that glue the fibroin chains together in forming the cocoon. The heavy and light fibroin chains are linked by a disulfide bond at the C-terminus of the two subunits (see Takei, et al., J. Cell Biol., 105:175, 1987; see also Tanaka, et al. J. Biochem. 114: 1, 1993; Tanaka, et al., Biochim. Biophys. Acta., 1432:92, 1999; Kikuchi, et al., Gene, 110:151, 1992). The sericins are a high molecular weight, soluble glycoprotein constituent of silk which gives the stickiness to the material. These glycoproteins are hydrophilic and can be easily removed from cocoons by boiling in water i.e., "degumming").

In some embodiments, silk polypeptide compositions utilized in accordance with the present compositions are substantially free of sericins (e.g., contain no detectable sericin or contain sericin at a level that one of ordinary skill in the pertinent art will consider negligible for a particular use).

In one exemplary method of obtaining silk polypeptide compositions, *B. mori* cocoons are boiled for about 30 minutes in an aqueous solution, such as, but not limited to, about 0.02M $Na_2CO_3$. The boiling (degumming) time is in a range of about 5 minutes to about 120 minutes and the boiling (degumming) temperature is in a range of about 30° C. to about 120° C. The cocoons may be rinsed, for example, with water to extract the sericin proteins and the extracted silk is dissolved in an aqueous salt solution. Exemplary non-limiting salts useful for this purpose include lithium bromide, lithium thiocyanate, calcium nitrate, and other chemicals capable of solubilizing silk. For example, the extracted silk is dissolved in about 9M to about 12 M LiBr solution. The salt is then removed, for example, by dialysis.

If desired, the solution can then be concentrated using, any method known in the art. For example, dialysis against a hygroscopic polymer, for example, PEG, a polyethylene oxide, amylose or sericin can be done. PEG having a molecular weight of about 8,000 g/mol to about 10,000 g/mol and has a concentration of about 25% to about 50%. Any dialysis system can be used, e.g., a slide-a-lyzer dialysis cassette (Pierce, MW CO 3500). The solution is dialyzed for a time period sufficient to result in a final concentration of aqueous silk solution of between about 1% to about 30%. In some cases, dialysis for about 2 hours to about 12 hours is sufficient.

In some embodiments, the substrate described herein is composed of a polymer including, but not limited to, a polyimide, polyester, polyethylene naphthalate, polyetherimide, fluropolymers and copolymers thereof.

In some embodiments, the substrate described herein is rigid and/or inflexible.

In some embodiments, the electrolyte described herein is composed of an aqueous electrolyte, a non-aqueous liquid electrolyte, an ionic liquid, an ion gel electrolyte, a solid-state electrolyte (e.g., solid-state polymer electrolytes), or combinations thereof. In some embodiments, the electrolyte is a liquid containing cations and anions including, but not limited to, saline, cell culture medium, buffers (e.g., phosphate buffered saline), buffered solutions (e.g. PBS), Dulbecco's Phosphate Buffer Saline (DPBS), Dulbecco's Modified Eagle Medium, fetal bovine serum, or suitable combinations and/or mixtures thereof.

In some embodiments, the electrolyte is an ionic liquid. The ionic liquid may comprise a cation based on ammonium, pyridinium, pyrrolidinium, pyrrolinium, oxazolium, oxazolinium, imidazolium, thiazolium, phosphonium ions, or combinations thereof. The ionic liquid may comprise an anion selected from phosphates, halophosphates, hexafluorophosphate, alkylphosphates, arylphosphates, nitrate, sulfate, bisulfate, alkylsulfates, arylsulfates, perfluorinated alkyl- and arylsulfates, sulfonate, alkylsulfonates, arylsulfonates, perfluorinated alkyl- and arylsulfonates, trifluoromethylsulfonate, bis (trifluoromethylsulfonyl) imide, tosylate, perchlorate, tetrachloroaluminate, heptachlorodialuminate, tetrafluoroborate, alkylborates, arylborates, amides, perfluorinated amides, dicyanamide, saccharinate, thiocyanate, carboxylates, especially acetates, trifluoroacetate, bis (perfluoroalkylsulfonyl) amide anions, and combinations thereof. The cations or anions may be substituted, for example, with a hydroxyl, substituted or unsubstituted alkyl having 1 to 8 carbon atoms, aryl group(s), and/or halogen group(s).

The metadevice 100 may be selectively modulated. Referring back to FIGS. 1A and 1B and FIG. 2, an amplitude-modulated metadevice 100 is depicted. This configuration is similar or equivalent to the depicted circuit in FIG. 1B, where the organic electrochemical transistor is in parallel to the DBSRR capacitance: when ON, the transistor effectively shorts the effective capacitance of the resonator, thus suppressing the resonance.

Figures 3A, 3B:
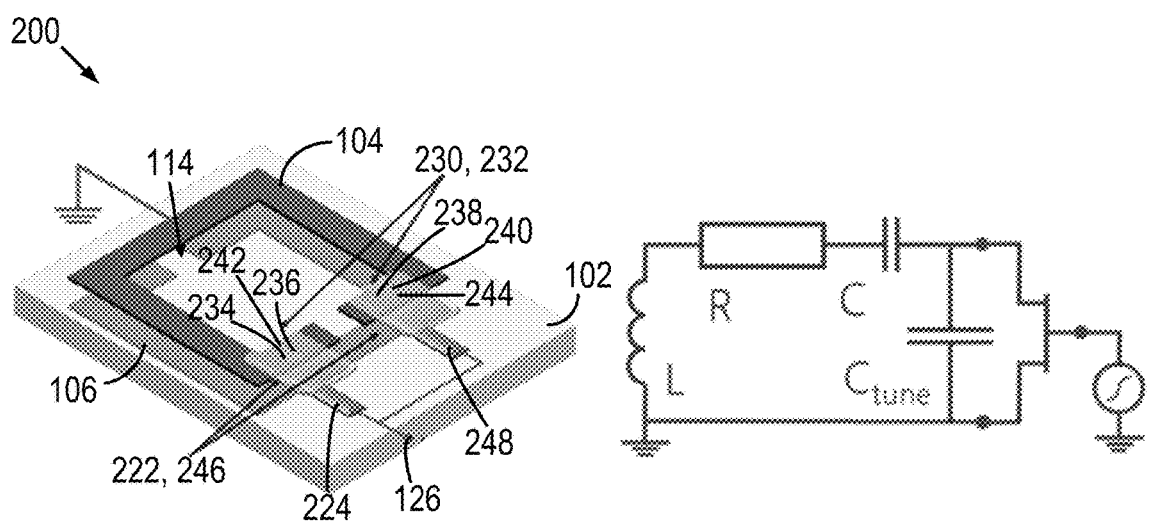
FIG. 3A is an illustration of a metadevice in accordance with some embodiments of the present disclosure. The metadevice is in a frequency-modulated DBSRR configuration having at least one additional gap fabricated on the a split-ring resonator.
FIG. 3B is a schematic illustration of the frequency-modulated DBSRR's equivalent circuit model, where the additional gaps filled with an OECT form a resulting tuning capacitance ($C_{tune}$, d) that modulates the resonant frequency of the circuit (C is capacitance, R is resistance, L is inductance).

The metadevice 100 may have alternative geometries. For example, FIGS. 3A and 3B illustrate a metadevice 200 (FIG. 3A) having a frequency-modulated configuration. In some embodiments as shown in FIG. 3A, frequency-modulated configuration may be obtained by incorporating at least one additional gap (e.g., a second gap 230 and/or a third gap 232) in the first resonator loop 104. The second gap 230 may be formed between opposing surfaces 234, 236 in the first resonator loop 104, and the third gap 232 may be formed between opposing surfaces 238, 240.

A second organic electrochemical transistor 242 may be positioned in the second gap 230. The second organic electrochemical transistor 242 may extend between the opposing surfaces 234, 236 in the first resonator loop 104 and may optionally be in direct contact with the opposing surfaces 234, 236. In some embodiments, a third electrochemical transistor 244 is positioned in the third gap 232. In some embodiments, the third electrochemical transistor 244 may extend between the opposing surfaces 238, 240 in the first resonator loop 104 and may optionally be in direct contact with the opposing surfaces 238, 240. An electrolyte 222 may connect the second organic electrochemical transistor 242 to a first gate electrode 224, and an electrolyte 246 may connect the third organic electrochemical transistor 244 to a second gate electrode 248. Each gate electrode 224 and 248 may be connected to the same source 126, or each respective electrode may have its own source (not shown). The source 126 may regulate the applied voltage to modulate the metadevice 200.

In some embodiments, while in the frequency-modulated configuration, the gap 108 (FIG. 1A) in the first resonator loop 104 is free of an organic electrochemical transistor material, and one or more of the additional gap(s) 230, 232 are filled with the organic electrochemical transistor material 242, 244 as shown in FIG. 3A. Although not illustrated in FIG. 3A, the gap 108 may be filled with an organic electrochemical transistor material and be coupled to a gate through an electrolyte, as depicted in FIG. 1A. In some embodiments, the gap 108 includes an electrical insulator (e.g., air) positioned therein.

As shown in FIG. 3B, the additional gap(s) 230, 232 to the first resonator loop 104 as shown in FIG. 3A act as tuning capacitors ($C_{tune}$) which can be excluded by the circuit when the OECT is in the ON state, leading to a change in resonance frequency, $f_0=1/(2\pi\sqrt{LC})$, wherein L is the inductance of the circuit and C is the capacitance of the circuit.

Referring to FIGS. 4A, 4B, 4C, 4D, 4E, and 4F, the metadevice 100 offers dynamic reconfiguration of different split-ring resonators through the integrated coplanar organic electrochemical transistor(s) e.g., 120 (e.g., FIG. 1A, FIG. 2), 242 (FIG. 3A), 244 (FIG. 3A). In FIGS. 4A, 4B, 4C, and 4D, the arrows in the plot represent the trend of the data as $V_{gate}$ increases. This tuning strategy may achieve up to a ~40 dB variation in amplitude-modulated devices, while in frequency-modulated DBSRRs such tuning strategy allows seamless transition between two different resonant configurations. The experimental characterization of both amplitude- and frequency-modulated metadevices is performed by measuring the return losses (Si scattering parameter) from a primary coil adjacent to the DBSRR. Data from a poly (3,4-ethylenedioxythiophene) polystyrene sulfonate (PEDOT:PSS) organic electrochemical material was used to generate FIGS. 4A, 4B, 4C, 4D, 4E, and 4F. The PEDOT:PSS operates as depletion mode transistors, which implies that the ON state is achieved at zero gate voltage ($V_{gate}$): as $V_{gate}$ increases, cations are injected within the bulk of the polymer where they compensate the sulfonate groups of the PSS, effectively dedoping the conjugated backbone of the PEDOT, and turning OFF the device.

For amplitude-modulated devices resonating at ~540 MHz, the variation in the reflection losses exceeds 20 dB, with a phase change of approximately 50° in the proximity of the resonance. Frequency-modulated devices resonating in the same region show a frequency shift of ~35 MHz. The effectiveness of the tuning mechanism is verified with DBSRRs of different sizes in mm, i.e. operating at different fundamental frequencies. FIG. 4F summarizes the amplitude and frequency modulation experiments performed on DBSRRs with lateral size of 8, 10 and 12 mm: the highest modulations are achieved with the smallest resonators, operating at approximately 730 MHz. The lower amplitude modulation associated to bigger devices is likely due to the complex permittivity of the gating electrolyte, whose imaginary component decreases with increasing frequency in this range.

Figure 5:
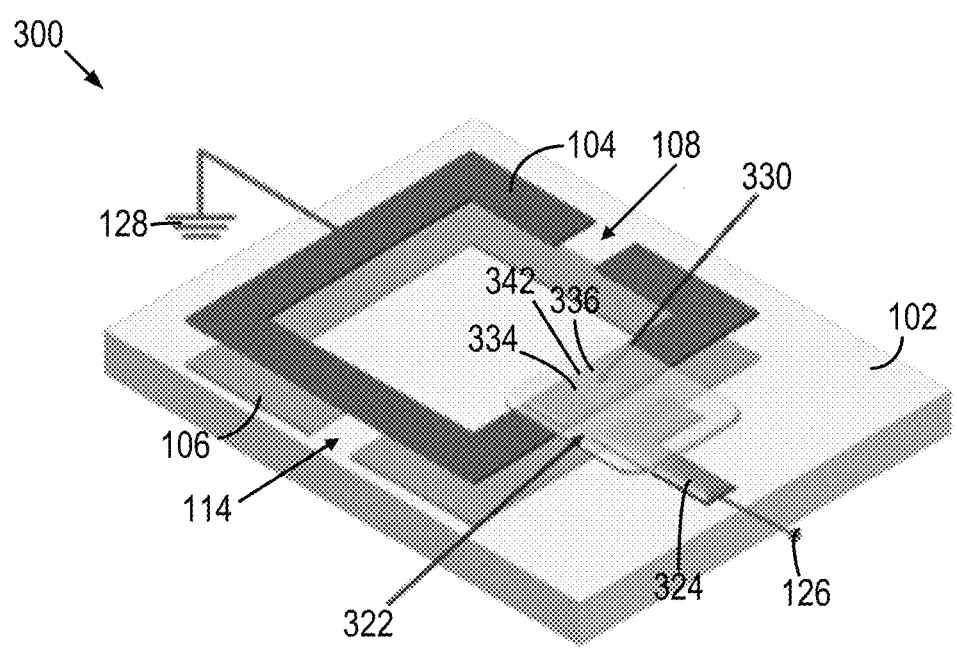
FIG. 5 is a schematic illustration of a metadevice in accordance with some embodiments of the present disclosure. The metadevice is illustrated as a frequency-modulated DBSRR having an additional gap fabricated on a side wall of the top split-ring resonator.

Referring to FIG. 5, a metadevice 300 is depicted with an alternative geometry. FIG. 5 depicts a metadevice 300 having a single, additional gap 330 (e.g., a second gap 330). The additional gap 330 may be formed between opposing surfaces 334, 336 in the first resonator loop 104. An organic electrochemical transistor 342 may be positioned in the additional gap 330. The organic electrochemical transistor 342 may extend between the opposing surfaces 334, 336, and may optionally be in direct contact with the opposing surfaces 334, 336. An electrolyte 322 may connect the organic electrochemical transistor 342 to a gate electrode 324. The source 126 may regulate the applied voltage to modulate the metadevice 300.

Figure 6:
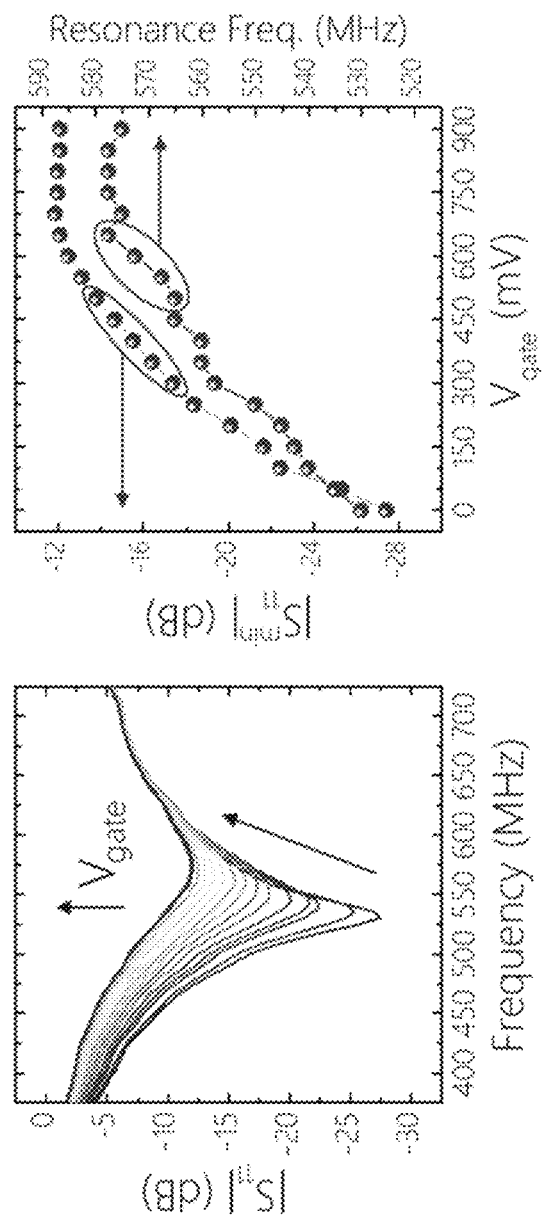
FIG. 6 illustrates $S_{11}$ graphs of the metadevice at different gating voltages: due to the asymmetry of the conductive pattern, the frequency modulation is associated to a decrease in amplitude (left) as denoted by the arrow, and a graph illustrating voltage dependence of the amplitude and of the resonance frequency (right) where the circle with attached arrow directs the eye to the correct Y axis.

In some embodiments, the first resonator loop 104 in the metadevice 300 has a square or rectangular geometry, and the second gap 330 is positioned on a side wall that is different than the side wall containing the gap 108. In some embodiments that are not shown, the first resonator loop 104 has a cylindrical geometry, and the additional gap 330 is located 5° to 365° away from the gap 108, particularly 90°, 180°, or 270° away from the gap 108. FIG. 6 depicts $S_{11}$ plots in dB of the metadevice 300 as shown in FIG. 5 at different gating voltages (ie., $V_{gate}$ in mV): due to the asymmetry of the conductive pattern, the frequency modulation is associated to a decrease in amplitude, and voltage dependence of the amplitude and of the resonance frequency.

Figure 7:
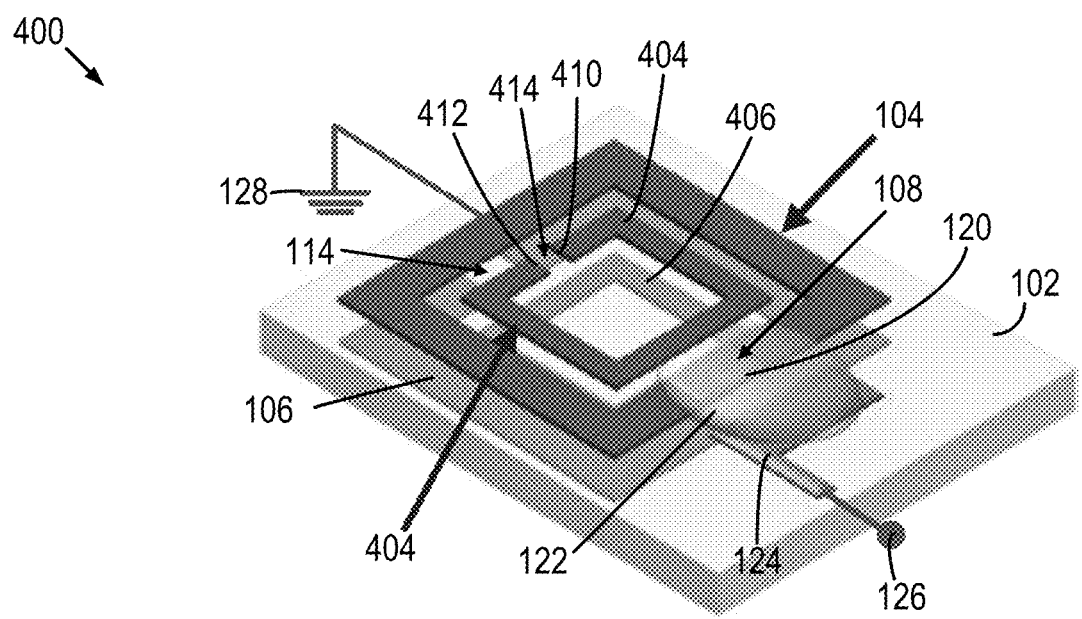
FIG. 7 is a schematic illustration of a metadevice in accordance with some embodiments of the present disclosure. The metadevice has a dual-band DBSRR configuration.

Referring to FIG. 7, a metadevice 400 is depicted with an alternative geometry. FIG. 7 depicts a metadevice 400 in a dual-band DBSSR configuration. In the dual-band DBSSR configuration, two concentric DBSRRs are patterned on each facial surface of the substrate 102. The outer resonator loops 104, 106 have the same configuration as depicted and described in FIG. 1. The metadevice 400 further includes a first inner resonator loop 404 configured inside of the first outer resonator loop 104, and a second inner resonator 406 configured inside of the second outer resonator loop 106. The first inner resonator loop 404 includes at least one gap 414 formed between opposing surfaces 410, 412 in the first inner resonator loop 404, and the second inner resonator 406 having at least one gap formed between opposing surfaces (not shown) in the second inner resonator loop 406. The first inner resonator loop 404 and the second inner resonator loop 406 may be assembled in a stacked, antiparallel configuration to form a dual-band DBSRR with the outer resonator loops 104, 106. In some embodiments, the gap 108 of the first outer resonator loop 104 is positioned on an opposite side in the stacked arrangement relative to gap 414 of the first inner resonator loop 404. Similarly, the gap of the second inner resonator loop 406 is positioned on an opposite side of the stacked arrangement relative to the gap 114 of the first outer resonator loop 106. In some embodiments, the at least one gaps of the inner resonator loops 404, 406 are substantially or entirely free of an organic electrochemical transistor material.

In some embodiments, the at least one gaps 414 of the inner resonator loops 404, 406 comprise an electrical insulator. In this way, the outer resonator loops 104, 106 may operate at a low-frequency (LF) resonance amplitude that is modified via the organic electrochemical transistor material 120, and the inner resonator loops 404, 406 operate at a high-frequency (HF) that remains stable. In some embodiments, the outer resonator loops 104, 106 do not comprise an organic electrochemical transistor material in the at least one gaps 108, 114 and at least one of the gaps 114, 414 of the inner resonator loops 404, 406 do comprise an organic electrochemical transistor material so that the HF loop is modified and the LF loop is stable.

Figure 8:
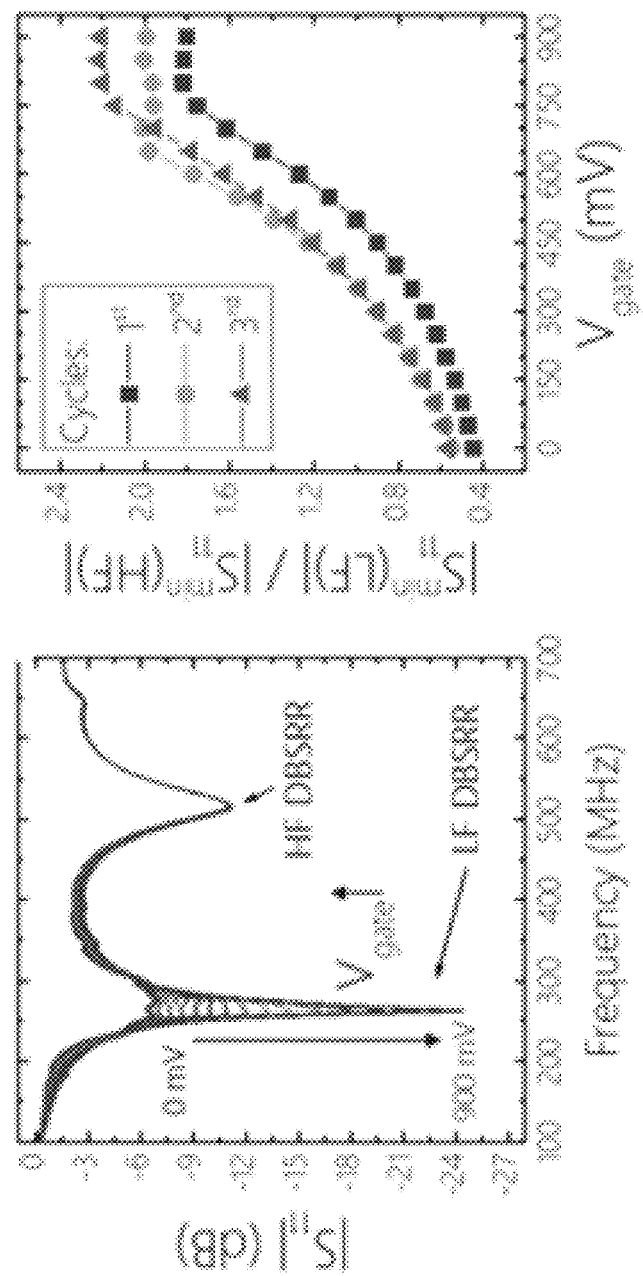
FIG. 8 illustrates $S_{11}$ plots of the metadevice at different gating voltages: while the Low-Frequency (LF) resonance amplitude associated to the outer device is modulated, the High-Frequency (HF) resonance amplitude is stable (left), and a plot illustrating voltage dependence of the amplitude modulation, reported as the ratio between the LF and the HF amplitudes for three consecutive cycles (right). The arrow pointing down shows the trend in amplitude modulation as a function of gate voltage.

FIG. 8 illustrates $S_{11}$ plots in dB of the device as shown in FIG. 7 at different gating voltages (i.e., $V_{gate}$): while the Low-Frequency (LF) resonance amplitude associated to the outer device is modulated, the High-Frequency amplitude device (HF) is stable. FIG. 8 further illustrates the voltage dependence of the amplitude modulation, reported as the ratio between the LF and the HF amplitudes for three consecutive cycles. The outer split-ring resonator and/or the inner split-ring resonator may be modulated to have the form of the split-ring resonators described with respect to FIGS. 1A, 1B, 2, 3A, 3B, 4A-4F, 5 and 6.

Figure 9:
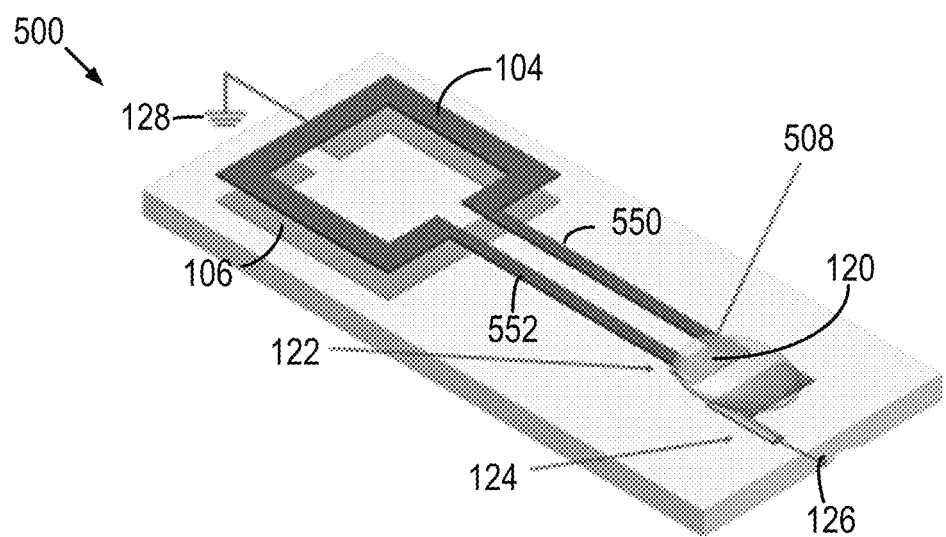
FIG. 9 is a schematic illustration of a metadevice in accordance with some embodiments of the present disclosure. The metadevice has an extended split.

Referring to FIG. 9, a metadevice 500 is depicted with an alternative geometry. FIG. 9 depicts a metadevice 500 includes similar features as described in FIG. 1, but includes an extended split gap 508. The extended split gap 508 is formed by two fingers 550, 552 extending from the gap 508 in the first resonator loop 104. The fingers 550, 552 may extend at a length that is 0.1 to 10 times the length of a sidewall in the metadevice 500. The organic electrochemical transistor 120 may extend the entire length of the fingers 550, 552, or extend along a portion of the length of the fingers 550, 552.

Figure 10:
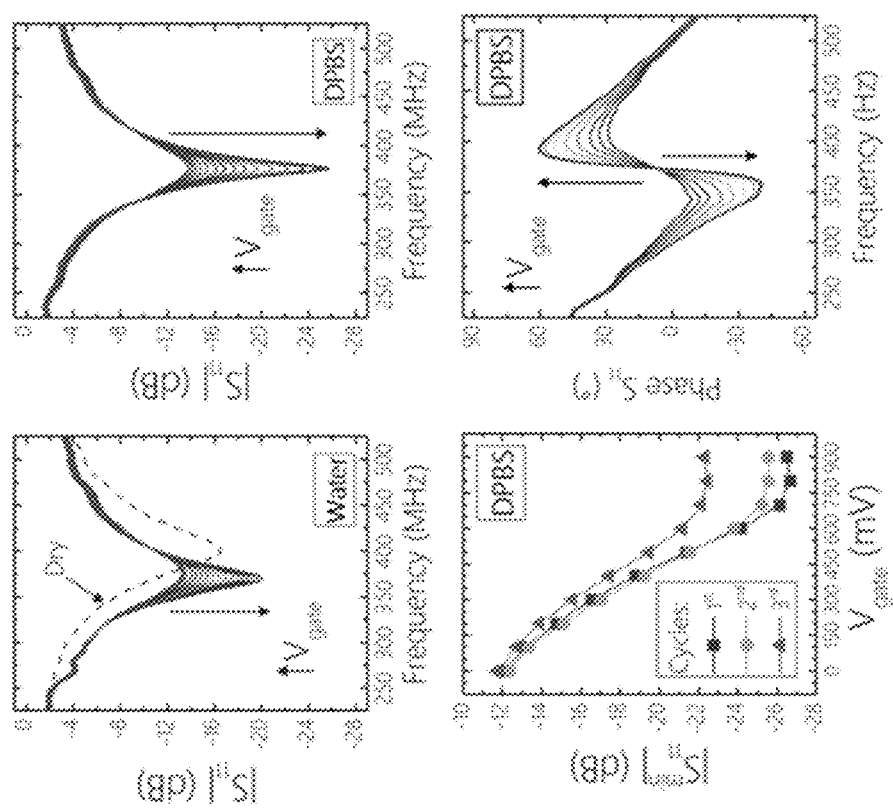
FIG. 10 illustrates $S_{11}$ plots of the device operating in deionized water (top left) and DPBS (top right); a voltage dependence of the amplitude plot, for three consecutive cycles (bottom left); and a plot of the $S_{11}$ phase at different gating voltages (bottom right). In all plots, arrows indicate the trend in data as a function of increasing gate voltage.

FIG. 10 illustrates $S_{11}$ plots of the device as shown in FIG. 9 operating in deionized water and Dulbecco's Phosphate-Buffered Saline (DPBS), as well as voltage dependence of the amplitude, for three consecutive cycles, and a plot of the $S_{11}$ phase at different gating voltages (brown to green).

Figure 11:
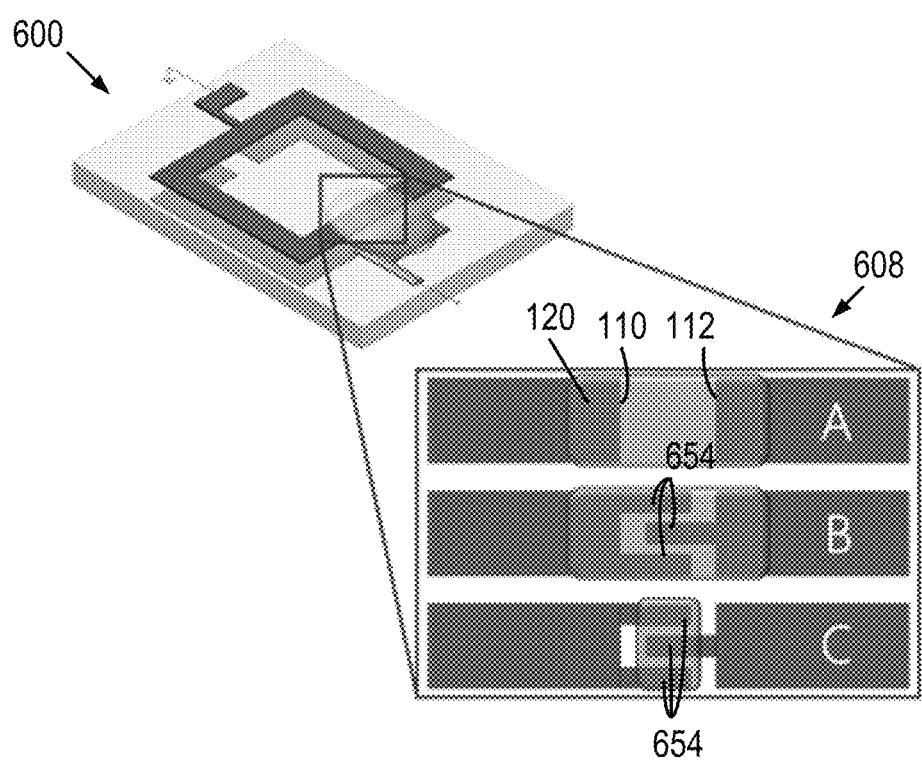
FIG. 11 is a schematic illustration of a metadevice in accordance with some embodiments of the present disclosure. The metadevice has a modified channel gap.

Referring to FIG. 11, a metadevice 600 is depicted with an alternative geometry. Alternate geometries A, B, and C are depicted. FIG. 11 depicts a metadevice 600 having similar features as described in FIG. 1, but has a modified channel gap 608. The modified channel gap 608 includes at least one channel finger 654 extending between the opposing surfaces 110, 112 of the first resonator loop 104. In some embodiments, the modified channel gap includes from 1 to 10 fingers, or more, extending within the gap 608. The at least one channel finger 654 may form a channel pattern in the modified channel gap 608. The at least one channel finger 654 may reduce the split length of the gap 608 to influence modulation of the metadevice 600.

Figure 12:
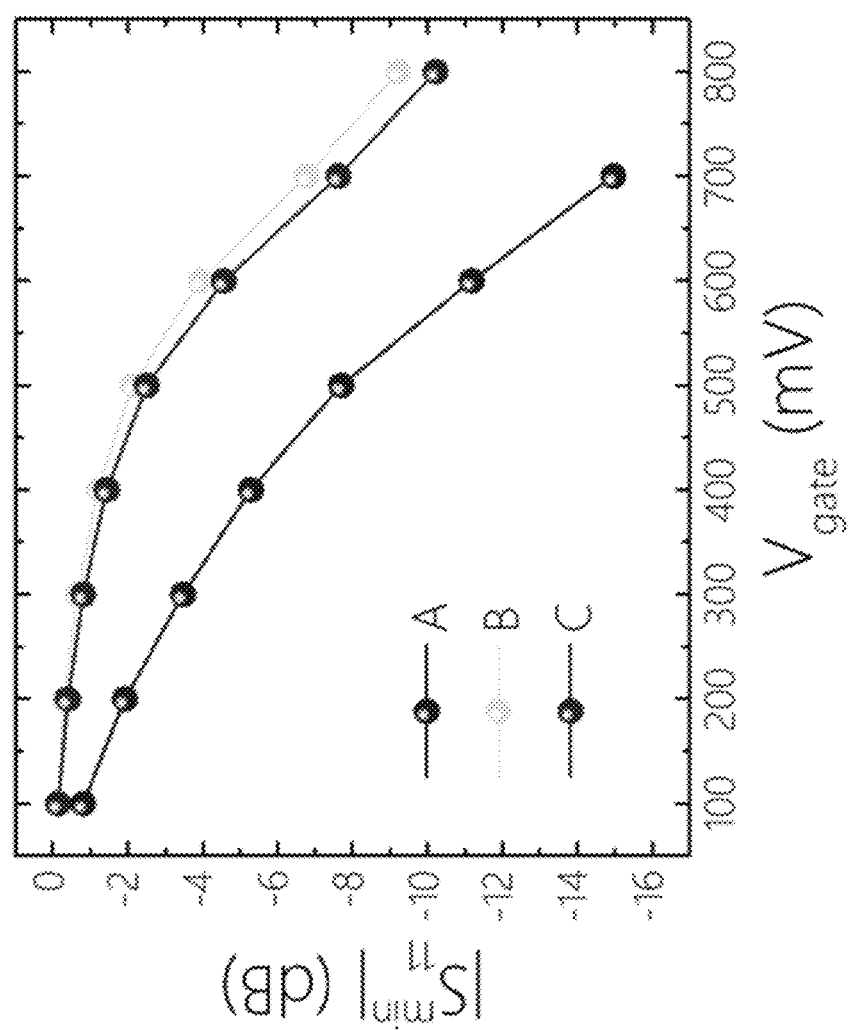
FIG. 12 illustrates a $S_{11}$ plot of the device operating with the modified channel gap of FIG. 11. Options B and C, with reduced split length, display a reduced modulation compared to the standard split.

FIG. 12 illustrates $S_{11}$ plots of the device as shown in FIG. 11 with the modified channel gap 608. The organic electrochemical transistor may cover a portion of the fingers, or completely surround the channel fingers 654. The curves labelled A, B, and C represent data from respective alternate gap geometries labeled as A, B, and C in FIG. 11.

Figure 13:
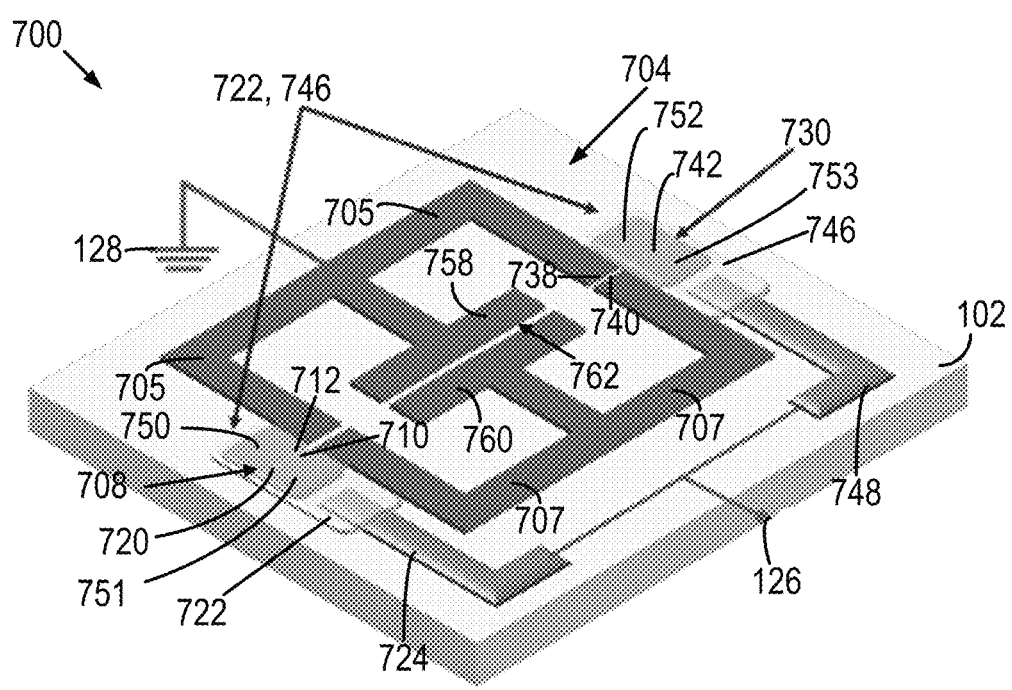
FIG. 13 is a schematic illustration of a metadevice in accordance with some embodiments of the present disclosure. The metadevice is formed into a patch antenna.

Referring to FIG. 13, a metadevice 700 is depicted with an alternative geometry. FIG. 13 illustrates a metadevice 700 having a resonator loop 704 that forms a patch antenna formed on a facial surface of the substrate 102. The resonator loop 704 may include a first inductive loop 705 and a second inductive loop 707 that forms a pattern (e.g., a square or rectangular pattern) on the facial surface of the substrate 102. The first inductive loop 705 and the second inductive loop 707 may be separated by a first gap 708 and a second gap 730 formed on opposing sides of the resonator loop 704 (e.g., opposing sides of the square or rectangular pattern). In some embodiments, the first inductive loop 705 includes an extended gap formed via fingers 750, 752 that extend from the first inductive loop 705. Similarly, the second inductive loop 707 may include an extended gap formed via fingers 751, 753 that extend from the second inductive loop 707. In some embodiments, the fingers 750, 752 and 751, 753 extend outward from the resonator loop 704 or inward into the resonator loop 704.

In some embodiments, the resonator loop 704 includes a capacitor positioned between the first inductive loop 705 and the second inductive loop 707. The capacitor includes a first conductive plate 758 connected to the first inductive loop 705 and a second conductive plate 760 connected to the second inductive loop 707, where the first and second conductive plates 758, 760 are separated by a gap 762.

In some embodiments, the first gap 708 includes an organic electrochemical transistor 720 positioned in the first gap 708. The organic electrochemical transistor 120 may extend between the opposing surfaces 710, 712 in the gap 708, and may optionally be in direct contact with either or both of the opposing surfaces 710, 712. Additionally or alternatively, the second inductive loop 707 includes a second organic electrochemical transistor 742 positioned in the second gap 730. The organic electrochemical transistor 742 may extend between the opposing surfaces 738, 740, and may optionally be in direct contact with either or both of the opposing surfaces 738, 740. An electrolyte 722 may extend between the first organic electrochemical transistor 720 and a first gate 724. A second electrolyte 746 may extend between the second electrochemical transistor 742 and the second gate 748. The gates 724, 748 may be connected to a source 126, and the resonator loop 704 may be connected to a drain 128.

Figure 14:
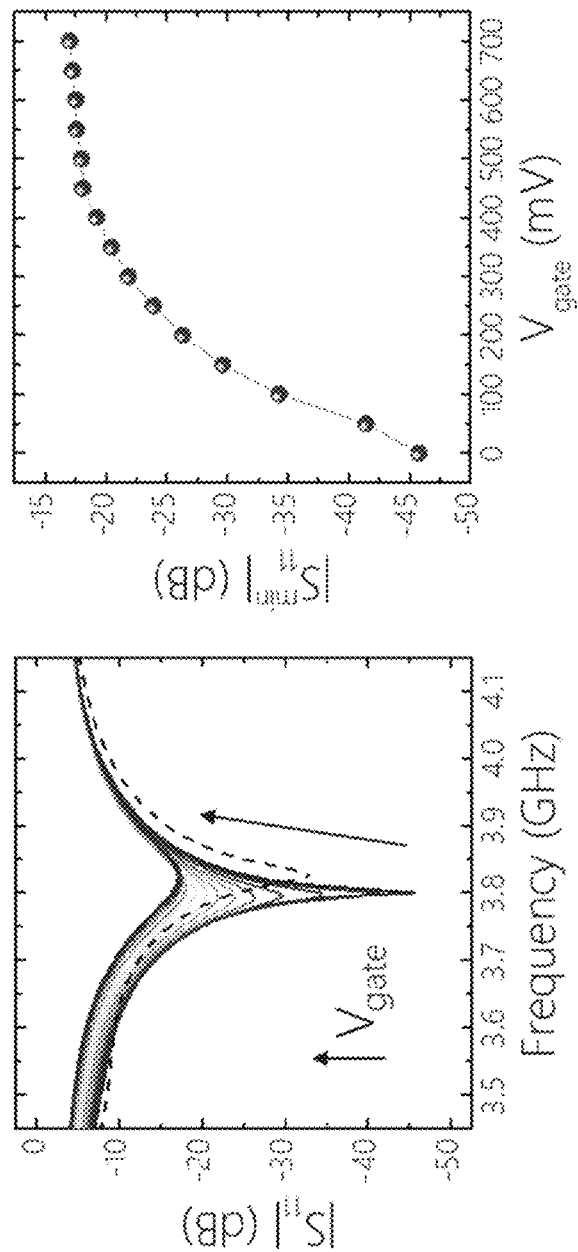
FIG. 14 illustrates return losses ($S_{11}$ plots) of a tunable ELC, monitored with an inset feed microstrip patch antenna, showing amplitude modulation exceeding 25 dB (dashed curve represents a dry device); and a plot of voltage dependence of the resonance amplitude. The arrow indicates the trend in amplitude modulation as a function of gate voltage.

Referring to FIG. 14, which depicts data relative to the device shown in FIG. 13, as equal voltage is applied through the two gate electrodes, and the conductivity of the organic electrochemical transistor is thus reduced, the dissipative losses of the resonator increase, quenching the resonance. The amplitude modulation for the device exceeds 25 dB. These results underscore the opportunity to use conductive polymers to electrically tune metadevices in the 0.1-5 GHz portion of the microwave spectrum.

Figure 15:
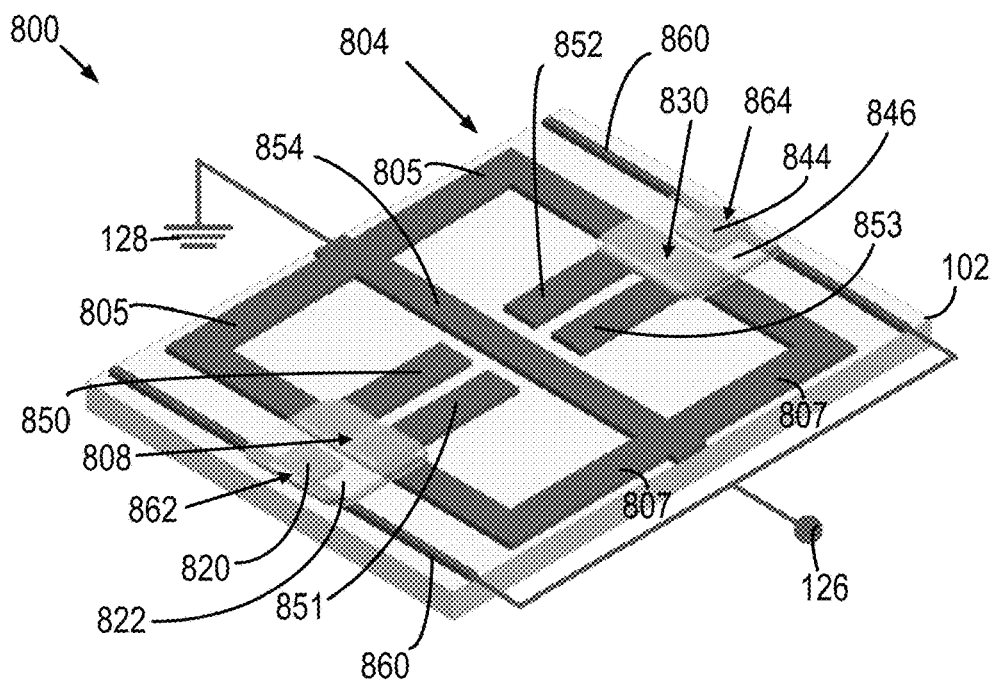
FIG. 15 is a schematic illustration of a unit cell within a metadevice in accordance with some embodiments of the present disclosure.
Figure 16:
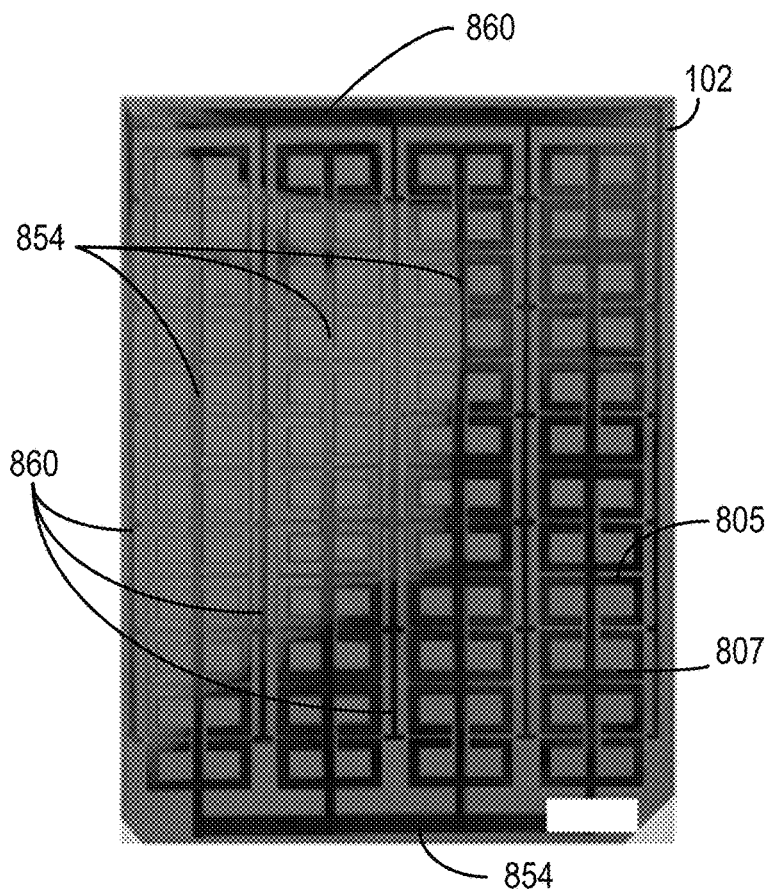
FIG. 16 is an exemplary image of the metadevice of FIG. 15 with an array of resonator loops in accordance with some embodiments of the present disclosure.

Referring to FIGS. 15 and 16, a metadevice 800 is depicted with an alternative geometry. FIG. 15 illustrates a unit cell within a metadevice 800 having an array of electric-LC structures (ELCs) on a facial surface of the substrate 102. In this configuration, the unit cell of the metadevice 800 includes a resonator loop 804. The resonator loop 804 includes a first inductive loop 805 and a second inductive loop 807 that forms a pattern (e.g., a square or rectangular pattern) on a facial surface of substrate 102. The first inductive loop 805 and the second inductive loop 807 may be separated by a first gap 808 and a second gap 830 formed on opposing sides of the resonator loop 804 (e.g., opposing sides of the square or rectangular pattern).

In some embodiments, as shown in FIG. 15 and FIG. 16, the first inductive loop 805 includes an extended gap formed via fingers 850, 852 that extend from the first inductive loop 805. Similarly, the second inductive loop 807 may include an extended gap formed from fingers 851, 853 that extend from the second inductive loop 807. In some embodiments, the fingers 850, 852 and 851, 853 extend inward into the resonator loop 804. In some embodiments, the resonator loop 804 includes a conductive material 854 that connects the first inductive loop 805 and the second inductive loop 807, which may run centrally through the resonator loop 804. The conductive material 854 may connect multiple resonator loops 804 in the metadevice 800 array, as shown in FIG. 16. In some embodiments, the conductive material 854 is connected to a drain 128.

In some embodiments, as shown in FIG. 15 and FIG. 16, the metadevice 800 further includes a perimeter conductive material 860 that surrounds the resonator loop 804. In some embodiments, the perimeter conductive material 860 includes up to an equal number of organic electrochemical transistors for each gap in the resonator loop 804. For example, the perimeter conductive material 860 may include a first gap 862 and a second gap 864. Organic electrochemical transistors 820, 844 may be positioned in the gaps 862, 864, respectively, of the perimeter conductive material 860.

In some embodiments, as shown in FIG. 15 and FIG. 16, a first electrolyte 822 extends between the organic electrochemical transistor 820 in the gap 862 of the perimeter conductive material 860 to the first gap 808 of the resonator loop 804. Similarly, a second electrolyte 846 may extend between the electrochemical transistor 844 in the gap 864 of the perimeter conductive material 860 to the second gap 864 in the perimeter conductive material 860. In some embodiments, the perimeter conductive material 860 is connected to a power source 126 for controlling the addition or subtraction of the electrolyte 822 into the organic electrochemical transistor 820, e.g., by controlling the applied voltage.

As shown in FIG. 16, the metadevice 800 may include an array of ELCs formed from a plurality of resonating loops 804 connected through conductive material 854, and a perimeter conductive material 860 that at least partially surrounds the resonating loops 804. The array of ELCs may include any number of resonating loops 804, e.g., at least 5, at least 10, at least 100 to less than 500, or less than 1,000. The resonating loops 804 may be organized into a plurality of rows and a plurality of columns. The perimeter conductive material 860 may extend between the plurality of columns or rows of resonating loops 804 so that organic electrochemical transistors are configured proximate to the corresponding gaps in the respective inductive loops. In some embodiments, the perimeter conductive material 860 extends between the plurality of columns or rows such that it extends parallel or substantially parallel (i.e., within plus or minus 5°, or 3°, or 1° of parallel) to the conductive material 854.

Figure 17:
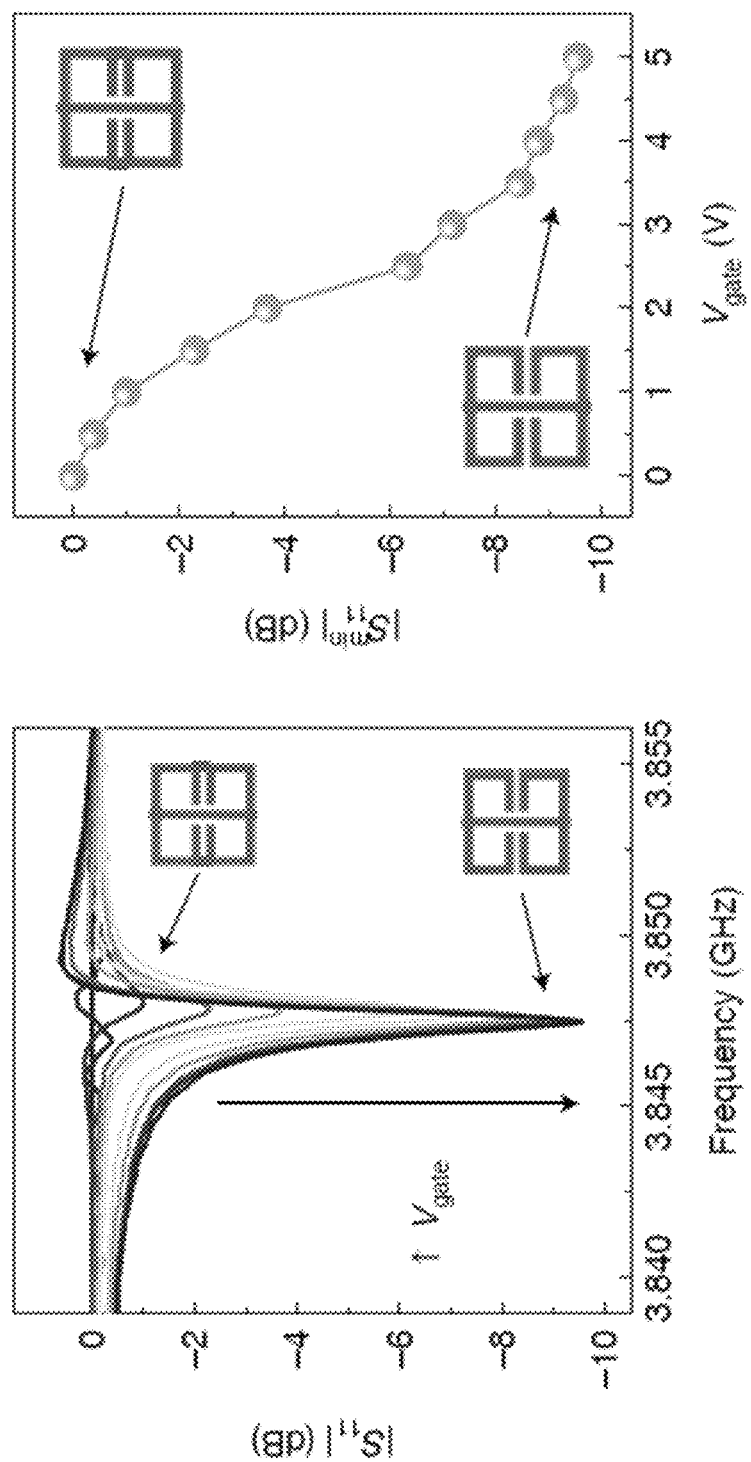
FIG. 17 is a graph illustrating return losses for the metadevice of FIG. 16, with $V_{gate}$ ranging from 0 to 5 V (plots are normalized to the 0 V spectrum) (left), and a graph illustrating voltage dependence of the resonance amplitude, normalized to the 0 V condition (right). The purely capacitive contribution of the two splits of the electric-LC structures (ELCs) is restored as the OECTs are gradually turned off when an equal positive potential is applied to the two gate electrodes.

FIG. 17 show exemplary plots of voltage dependence of the amplitude and phase of the $S_{11}$ parameter in dB at/near the resonance frequency in GHz (left; the arrows in the plot represent the trend of the data as $V_{gate}$ increases), and $S_{11}$ plots in dB of the frequency-modulated device for increasing $V_{gate}$ in V (right). Spectra are normalized to the initial $V_{gate}$=0 V bias condition.

The present disclosure provides considerable versatility through the ability to electrostatically modulate the bulk conductivity of organic mixed ionic-electronic conductors, paired with the ease of processing and fabrication on a variety of rigid and flexible substrates with a wide set of deposition techniques, including high-throughput printing. While this work investigates the low region of the microwave spectrum, the conductivity of conductive polymers, e.g., PEDOT:PSS-based formulations, at THz frequencies is readily extendable to higher spectral bands through the use of similar electrical tuning strategies, further adding utility to this approach. The results presented here suggest that this class of devices is ideally positioned to complement many recent demonstrations of the potential of organic mixed ionic-electronic conductors, such as enzyme-coupled sensors, neuromorphic, and 3D transistors, where these reconfigurable, adaptable devices could be applied to generate a new class of wireless technological interfaces.

EXAMPLES

The following examples will enable one of skill in the art to more readily understand the principles thereof. The following examples are presented by way of illustration and are not meant to be limiting in any way.

Materials and Inks:

Polyimide substrates (~50 μm thick) were donated by FLEXcon™ and used without cleaning or surface treatment. The silver nanoparticle dispersion (Silverjet DGP-40LT-15C, silver ink) was purchased from Sigma Aldrich and the PEDOT:PSS printable ink was purchased from Heraeus (Clevios P Jet 700). Dulbecco's phosphate-buffered saline was purchased from Thermo Fisher Scientific and used as gating medium. The ionic liquid 1-ethylimidazolium bis (trifluoromethylsulfonyl) imide was purchased from Iolitec (98% grade). Polymeric insulator poly (vinylidene fluoride-co-hexafluoropropylene) pellets with an average weight-average molecular weight of ~400,000 and an average number-average molecular weight of ~130,000 were purchased from Sigma Aldrich.

Metadevice Fabrication:

All inks were deposited with a Fujifilm Dimatix, DMP2800 inkjet printer. The SRR structures and gate electrodes were prepared by inkjet printing the silver nanoparticle dispersion directly on the untreated substrates, followed by a sintering step (180° C., 15 min). After sintering, the procedure was repeated to increase the conductivity of the pattern. The PEDOT: PSS ink was then printed on the gate electrode, and on the split/gap area of the SRRs (three layers each). After deposition, the samples were annealed at 120° C. for 30 min.

The tunable metasurface and the resonators used to characterize the operating stability were fabricated by thermal evaporation through a shadow mask (Cr/Au: 5 nm/100 nm) and spin-coating (PEDOT: PSS, 1,000 r.p.m. for 60 s, followed by annealing at 120° C. for 30 min). The organic mixed ionic-electronic conductor (OMIEC) was then patterned on the OECT gate and channel using a cleanroom swab wetted in ethanol. Electrolyte ion gels were prepared according to Melianas, A. et al. (Temperature-resilient solid-state organic artificial synapses for neuromorphic computing. Sci. Adv. 6, eabb2958 (2020)), and drop-cast on the transistor channel and gate area (~5 μl per device).

Microwave Characterization:

The scattering parameters were acquired using a primary coil (DBSRRs), a conical horn antenna (metasurface) and a microstrip-patch antenna (individual ELC) connected to a vector network analyser (Tektronix TTR506A, Rohde & Schwartz ZNB4.22). Modulation and cycling stability experiments were performed using a Keithley 4200A-SCS parameter analyser to bias the devices through two micro-manipulator probes (DPP220-V-S Probes, FormFactor). Small strips of KAPTON™ tape were used to confine the electrolyte on the gate and channel area of the transistors during measurements.

Simulations:

The numerical calculations were performed using the frequency domain solver of CST Microwave Studio. For frequency modulated DBSRRs, the frequency shifts of the devices were simulated by considering a DBSRR structure and one modified with the two additional gaps. In both scenarios, magnetic and electric boundary conditions were established along the xy and yz planes respectively, with the incident plane wave propagating normal to the xz plane. The simulated and experimental resonance frequency shifts were calculated for devices of 8, 10 and 12 mm in lateral size. The ELC structure used in this work was simulated by applying magnetic and electric boundary conditions along the transverse planes (yz and xz respectively), with a normally incident plane wave.

Exemplary Device and Tuning:

A metadevice having a double broadside-coupled SRR geometry (DBSRR) was produced having the structure as illustrated in FIG. 1A. The DBSRR geometry has the advantage of having a smaller form factor and lower resonant frequency compared to other magnetic SRR-based structures with equivalent lateral dimensions, without loss of generality for what concerns the applicability of the proposed tuning strategy. A silver nanoparticle dispersion was deposited to form the DBSRRs and the first layer of the gate electrodes, and a PEDOT: PSS solution was used for the transistor channel and as a conductive coating for the gate electrode. Amplitude modulation is achieved by depositing the PEDOT: PSS channel across the split of one of the resonators composing the DBSRR (FIG. 1A). From an electrical point of view, this configuration is equivalent to the circuit shown in FIG. 1B, with the organic electrochemical transistor (OECT) in parallel to the DBSRR capacitance: when on, the transistor effectively shorts the effective capacitance of the reso-nator, thus suppressing the resonance. Frequency modulation is obtained by introducing additional gaps to the top resonator of a DBSRR: these gaps acts as a tuning capacitor ($C_{tune}$, FIG. 3A), which and be excluded by the circuit when the OECT is in the on state, leading to a change in resonance frequency.

Characterization of Tunable SRRs:

FIGS. 4(A-F) illustrate the dynamic reconfiguration of different DBSRRs using the integrated coplanar OECTs. This simple tuning strategy may achieve a variation up to ~40 dB in amplitude-modulated devices, while in frequency-modulated DBSRRs it allows a seam-less transition between two different resonant configurations. The experimental characterization of both amplitude- and frequency-modulated resonators is performed by measuring the return losses ($S_{11}$ scattering parameter) from a primary coil adjacent to the DBSRR. PEDOT: PSS OECTs operate as depletion-mode transistors, which implies that the on state is achieved at zero gate voltage, $V_{gate}$. As $V_{gate}$ increases, cations are injected within the bulk of the polymer, where they compensate the sulfonate groups of the PSS, effectively dedoping the conjugated backbone of the PEDOT, and turning off the device. For amplitude-modulated devices resonating at ~540 MHz, the variation in the reflection losses exceeds 20 dB, with a phase change of ~50° in the proximity of the resonance.

Frequency-modulated devices resonating in the same region show a frequency shift of ~35 MHz. The effectiveness of the tuning mechanism is verified with DBSRRs of different sizes, that is, operating at different fundamental frequencies. FIG. 4F summarizes the amplitude- and frequency-modulation experiments performed on DBSRRs with lateral size of 8, 10 and 12 mm: the highest modulations are achieved with the smallest resonators, operating at ~730 MHz.

The lower-amplitude modulation associated with bigger devices is probably due to the complex permittivity of the liquid gating electrolyte, whose imaginary component decreases with increasing frequency in this range. On the other hand, the active frequency shift does not appear to be limited by the tuning strategy—the integrated OECTs simply allow the gradual transition from two resonating configurations, with and without the additional gaps (FIG. 4E), as visible also from simulations. This tuning strategy was also tested using different gating media and three alter-native DBSRR configurations, including an asymmetric structure and a dual-band device.

Tunable Metasurface:

The potential and versatility of this approach can be further demonstrated in a tunable metasurface composed of ELCs, operating at ~3.8 GHz. Similar to magnetic SRRs, ELCs are inductive-capacitive resonators, but, unlike their counterparts, they demonstrate weak coupling to uniform magnetic fields and a rather strong one to uniform electric fields. When appropriately combined with magnetic resonators, such as DBSRRs, ELCs can be used to realize negative-refractive-index metamaterials. FIG. 15 shows a schematic representation of the unit cell within an exemplary tunable metadevice, and FIG. 16 shows a metadevice composed of 24 ELCs (four columns×six rows). In this configuration, two OECTs were fabricated across an equal number of splits along the perimeter of each resonator within the array, and a common ion gel was used as gating medium to facilitate device handling. Similarly to the amplitude-modulated DBSRRs, the OECTs are gradually turned off when an equal positive potential is applied to the two gate electrodes, restoring the purely capacitive contribution of the two splits of the ELCs. This transition leads to an increase in the return losses of the metasurface, as is visible from the $S_{11}$ plots in FIG. 17 (spectra normalized to the initial $V_{gate}=0$ V bias condition).

Unlike the previous examples of tunable DBSRRs and individual ELCs, the operating voltage of this reconfigurable metasurface exceeds 1 V. This is to be expected, because the latter configuration displays a gate electrode smaller in size than the overall OECT channel area. In fact, while individual resonators exhibit gating regions that are relatively larger than the transistor channel area, the ELCs composing the metasurface are characterized by a reduced gate electrode to ensure a more compact design. This results in a diminished capacitive coupling between the gate electrode and the OMIEC, leading to higher operating voltages.

The present disclosure has described one or more preferred embodiments, and it should be appreciated that many equivalents, alternatives, variations, and modifications, aside from those expressly stated, are possible and within the scope of the invention.

We claim:

1. A metadevice comprising:
   a substrate;
   a resonator loop coupled to the substrate, the resonator loop having a first gap in the resonator loop;
   an organic electrochemical transistor positioned in the first gap;
   a gate electrode; and
   an electrolyte extending between the organic electrochemical transistor and the gate electrode, wherein the substrate is flexible.

2. The metadevice according to claim 1, wherein the organic electrochemical transistor is composed of a conjugated conducting polymer.

3. The metadevice according to claim 2, wherein the conjugated conducting polymer comprises a thiophene-based monomer or a fluorene-based monomer.

4. The metadevice according to claim 1 further comprising a second resonator loop coupled to the substrate, the second resonator loop having a second gap formed in the second resonator loop.

5. The metadevice of claim 4, wherein the resonator loop and the second resonator loop form a broadside-coupled split ring resonator.

6. The metadevice of claim 4, wherein the resonator loop and the second resonator loop form an edge-coupled split ring resonator.

7. The metadevice of claim 4, wherein the first second gap in the second resonator loop is free of an organic electrochemical transistor.

8. The metadevice according to claim 1, wherein the resonator loop includes a second gap formed in the resonator loop.

9. The metadevice according to claim 8, wherein the second gap includes a second organic electrochemical transistor positioned in the second gap.

10. The metadevice according to claim 9, wherein the second gap is formed from opposing surfaces that are spaced in the resonator loop, and wherein the second organic electrochemical transistor is in direct contact with the opposing surfaces.

11. The metadevice according to claim 10 further comprising a second gate electrode; and
    a second electrolyte extending between the second organic electrochemical transistor and the second gate electrode.

12. The metadevice according to claim 8, wherein the second gap is free of an organic electrochemical transistor.

13. The metadevice according to claim 1, further comprising a third gap formed in the resonator loop.

14. The metadevice according to claim 13, wherein the third gap is free of an organic electrochemical transistor.

15. The metadevice according to claim 1, wherein the resonator loop includes a first inductive loop and a second inductive loop that form a pattern on the substrate, wherein the first inductive loop and the second inductive loop are separated by the first gap and a second gap formed on opposing sides of the resonator loop,
   wherein the first gap is between the first inductive loop and the second inductive loop and includes the organic electrochemical transistor, wherein the second gap is between the first inductive loop and the second inductive loop and includes a second organic electrochemical transistor, and wherein a capacitor is configured between the first inductive loop and the second inductive loop.

16. The metadevice of claim 15, further comprising a second gate electrode and a second electrolyte extending between the second organic electrochemical transistor and the second gate electrode.

17. The metadevice according to claim 1, wherein the substrate is composed of a polypeptide.

18. A metadevice comprising:
a substrate;
a resonator loop coupled to the substrate, the resonator loop having a first inductive loop and a second inductive loop that form a pattern on the substrate, wherein the first inductive loop and the second inductive loop are separated by a first gap and a second gap formed on opposing sides of the resonator loop, and wherein a capacitor is configured between the first inductive loop and the second inductive loop;
a first organic electrochemical transistor positioned in the first gap between the first inductive loop and the second inductive loop,
a second organic electrochemical transistor positioned in the second gap between the first inductive loop and the second inductive loop;
a first gate electrode;
a second gate electrode;
a first electrolyte that extends between the first organic electrochemical transistor in the first gap to the first gate electrode; and a second electrolyte that extends between the second organic electrochemical transistor in the second gap to the second gate electrode, wherein the substrate is flexible.

19. A metadevice comprising:
a substrate;
a resonator loop coupled to the substrate, the resonator loop having a first inductive loop and a second inductive loop that form a pattern on the substrate, wherein the first inductive loop and the second inductive loop are separated by a first gap and a second gap formed on opposing sides of the resonator loop, and wherein the resonator loop includes a conductive material that connects the first inductive loop to the second inductive loop;
a perimeter conductive material that at least partially surrounds the resonator loop, wherein the perimeter conductive material includes a first organic electrochemical transistor positioned in a third gap in the perimeter conductive material, and wherein the perimeter conductive material includes a second organic electrochemical transistor positioned in a fourth gap in the perimeter conductive material;
a first electrolyte that extends between the first organic electrochemical transistor in the third gap of the perimeter conductive material to the first gap in the resonator loop; and
a second electrolyte that extends between the second organic electrochemical transistor in the fourth gap of the perimeter conductive material to the second gap in the first resonator loop.

20. The metadevice of claim 19, wherein the substrate is flexible.

* * * * *

UNITED STATES PATENT AND TRADEMARK OFFICE
CERTIFICATE OF CORRECTION

| | | |
|---|---|---|
| PATENT NO. | : 12,261,346 B2 | Page 1 of 1 |
| APPLICATION NO. | : 17/449935 | |
| DATED | : March 25, 2025 | |
| INVENTOR(S) | : Omenetto et al. | |

It is certified that error appears in the above-identified patent and that said Letters Patent is hereby corrected as shown below:

In the Specification

In Column 2, Line 43, delete "Sn" and insert --$S_{11}$-- therefor

In Column 11, Line 7, delete "(Si" and insert --($S_{11}$-- therefor

In the Claims

In Column 18, Line 34, in Claim 7, before "second", delete "first"

In Column 20, Line 30, in Claim 19, before "resonator", delete "first"

Signed and Sealed this
Tenth Day of June, 2025

Coke Morgan Stewart
*Acting Director of the United States Patent and Trademark Office*